United States Patent
Choi et al.

(10) Patent No.: US 8,401,613 B2
(45) Date of Patent: Mar. 19, 2013

(54) PET-MRI COMBINATION APPARATUS

(75) Inventors: Yong Choi, Seoul (KR); Ji Hoon Kang, Mokpo-si (KR); Jin-Ho Jung, Seoul (KR); Key Jo Hong, Seoul (KR); Wei Hu, Seongnam-si (KR); Byung Jun Min, Gwangmyeong-si (KR)

(73) Assignee: Industry-University Cooperation Foundation Sogang University (KR)

( * ) Notice: Subject to any disclaimer, the term of this patent is extended or adjusted under 35 U.S.C. 154(b) by 385 days.

(21) Appl. No.: 12/566,582

(22) Filed: Sep. 24, 2009

(65) Prior Publication Data

US 2010/0217112 A1  Aug. 26, 2010

(30) Foreign Application Priority Data

Feb. 24, 2009  (KR) .................. 10-2009-0015340

(51) Int. Cl.
*A61B 5/05* (2006.01)
(52) U.S. Cl. ......... 600/411; 600/407; 600/410; 600/436
(58) Field of Classification Search .................. 600/407, 600/410–423, 436
See application file for complete search history.

(56) References Cited

U.S. PATENT DOCUMENTS

| | | | |
|---|---|---|---|
| 5,808,376 A | 9/1998 | Gordon et al. | |
| 7,286,867 B2 * | 10/2007 | Schlyer et al. | 600/407 |
| 7,667,457 B2 * | 2/2010 | Linz et al. | 324/307 |
| 2003/0090267 A1 * | 5/2003 | Rubashov | 324/318 |
| 2008/0146914 A1 | 6/2008 | Polzin et al. | |

FOREIGN PATENT DOCUMENTS

| | | |
|---|---|---|
| JP | 2004-209297 A | 7/2004 |
| JP | 2004-226256 | 8/2004 |
| KR | 10-0618628 A | 9/2006 |
| KR | 10-0842682 A | 7/2008 |
| WO | 2006/071922 A2 | 7/2006 |
| WO | 2006/119085 A2 | 11/2006 |
| WO | 2008/127369 A2 | 10/2008 |

OTHER PUBLICATIONS

Pichler et al., Performane Test of a LSO-APD PET module in a 9.4 Tesla Magnet. 1998. IEEE. pp. 1237-1239.*
Ganesh et al., Accurate Real-Time Feedback of Surface EMG During fMRI. 2007. J Neurophysiology. pp. 912-920.*
Final Rejection dated Sep. 25, 2012 of corresponding Japanese Patent Application No. 2009-223086 with English translation—4 pgs.
Office Action dated Apr. 16, 2012 for corresponding JP Application No. 2009-223086.

* cited by examiner

*Primary Examiner* — James Kish
(74) *Attorney, Agent, or Firm* — Knobbe, Martens, Olson & Bear, LLP

(57) ABSTRACT

Disclosed herein is a PET-MRI combination apparatus which can extend transaxial and axial fields of view (FOV) by transmitting an output signal from a photo sensor to the outside of an MRI bore using cable. The PET-MRI combination apparatus includes an MRI bore for capturing an MR image of an object. A PET detector is installed inside imaging space of the MRI bore, and is configured such that a plurality of scintillation crystal arrays, each having scintillation crystals arranged in a ring shape, is arranged in a longitudinal direction so as to extend a axial field of view (FOV). A PET circuit unit is installed outside the MRI bore to prevent the PET circuit unit from being influenced by a magnetic field in the MRI bore, and is configured to include a signal amplification circuit and a signal processing circuit. A cable is configured to connect the PET detector to the PET circuit unit.

13 Claims, 3 Drawing Sheets

Fig. 2
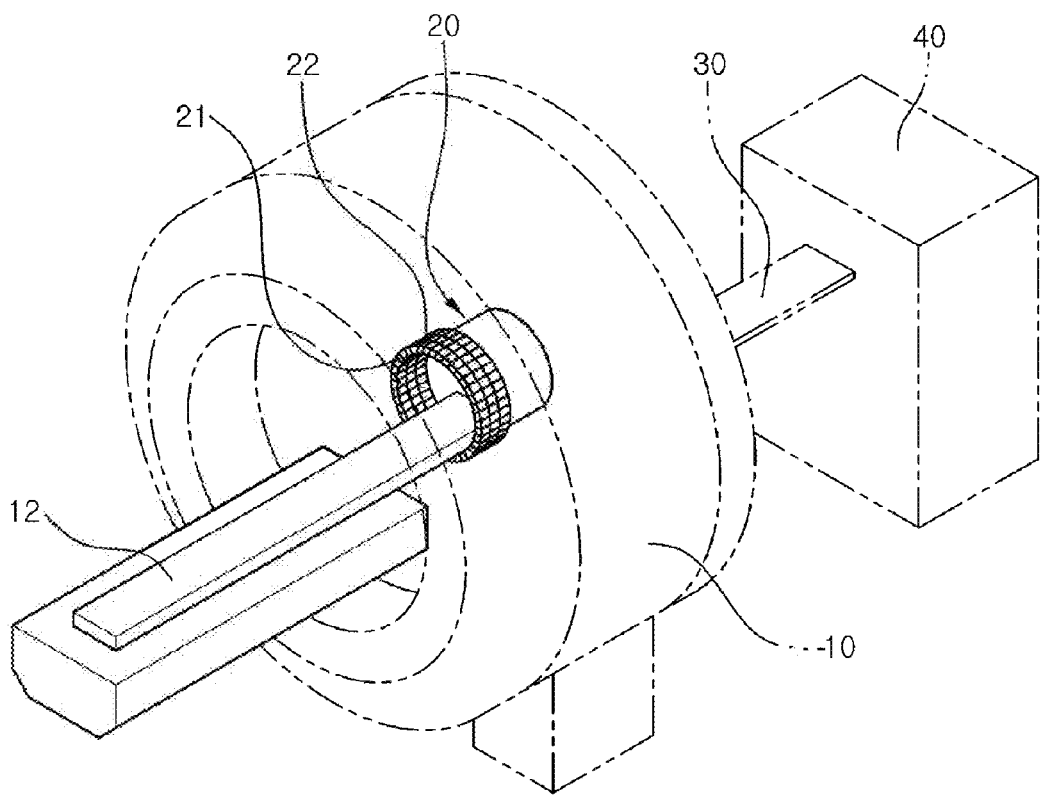
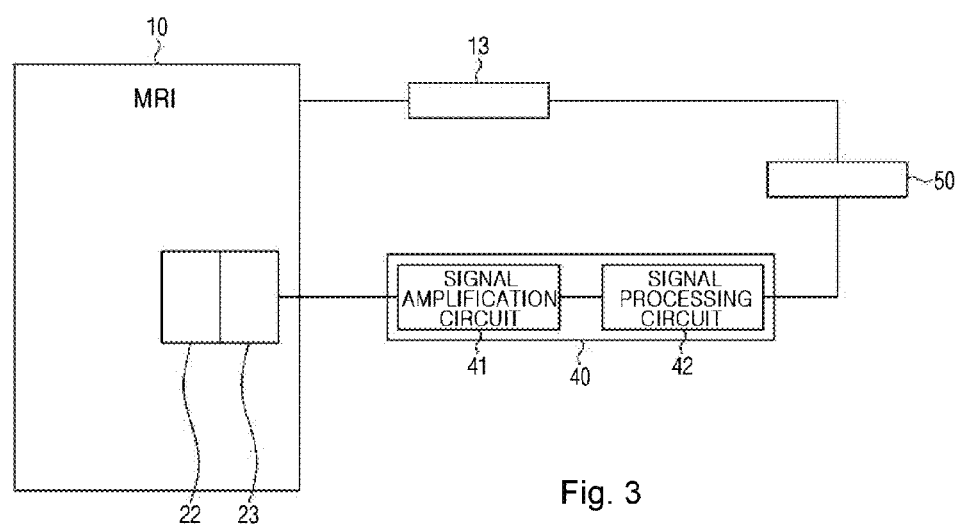
Fig. 3

PET-MRI COMBINATION APPARATUS

RELATED APPLICATIONS

This application claims priority to Korean Patent Application No. 10-2009-0015340 filed on Feb. 24, 2009, which is hereby incorporated by reference in its entirety herein.

BACKGROUND

1. Field

The present invention relates, in general, to a Positron Emission Tomography (PET)-Magnetic Resonance Imaging (MRI).

2. Description of Related Technology

PET was developed in mid-1975 by M. Ter-Pogossian, M. Phelps, et al. at Washington University in St. Louis, Mo. in the United States through the use of the principle of the coincidence detection of annihilation radiation. Since then, PET has been developed by several commercial companies including CPS-CTI. Recently, the utilization of PET has greatly increased in the form of PET-Computed Tomography (CT) combination imaging devices.

Meanwhile, MRI was developed in 1973 by P. Lauterbur. MRI is similar to CT or PET to some degree, but is different from them in physical principles. Currently, 10,000 or more MRI devices are used in hospitals all over the world. Basically, since such an MRI device is a morphological or anatomical imaging space rather than a functional imaging space, molecular specificity is insufficient. However, an MRI device has higher temporal and anatomical resolution than a PET device. Further, functional MRI (fMRI) to which a function of obtaining functional images is added was developed by S. Ogawa in 1992. As such a function related to functional images is added, an fMRI device has become a device capable of providing the most excellent brain image in the fields of neuroscience.

When an fMRI device was developed and introduced into the world, the entire academic world related to neuroscience enthusiastically accepted such a new device because an fMRI device was from the standpoint of brain images a very striking device. However, as requests for molecular specificity have been made, that enthusiasm did not last long, and thus attention fundamentally reverted once again to PET. As is well known to those skilled in the art, PET has two principal abilities, specifically, the ability to measure the affinity/distribution of metabolism of specific dispositions such as glucose and ganciclovir, and the ability to measure the affinity/distribution of specific neuroreceptors to ligands of neurotransmitters.

As described above, PET and MRI devices have their own peculiar advantages and disadvantages. In more detail, a PET device can provide body tissue-related molecular and functional information in very high contrast. However, since a PET device fundamentally has a low resolution, there is a limitation in providing anatomical information. In contrast, an MRI device can provide detailed anatomical information about body tissues, but has a limitation in providing molecular and functional information, compared to a PET device.

As described above, due to the advantages and disadvantages of PET and MRI devices, Korean Patent No. 10-0842682 discloses a PET-MRI hybrid system devised to combine PET and MRI devices with each other and obtain anatomical information and molecular information alongside each other. This system is configured such that a first scanner and a second scanner are connected to each other through a transport rail, and a table capable of holding an examination target is provided on the transport rail, thus sequentially obtaining a PET image and an MRI image.

However, the above system disclosed in Korean Patent No. 10-0842682 is problematic in that the object transport rail occupies a large amount of space, and time is required to transport an object from the first scanner to the second scanner through the transport rail, and thus it is impossible to simultaneously obtain PET and MRI images.

In order to solve this problem, in the related technical field, International Patent Publication No. WO06/119085 discloses a PET scintillation detection unit having an optical fiber and an MRI-PET combination system using the same, International Patent Publication No. WO06/071922 discloses an integrated PET/MRI imaging system and PET detector for an Avalanche Photodiode (APD) base for use in simultaneous PET/MRI imaging, and International Patent Publication No. WO08/127369 discloses hybrid PET/MR imaging system.

The PET scintillation detection unit having an optical fiber and the MRI-PET combination system using the same, disclosed in International Patent Publication No. WO06/119085, are configured such that the scintillation detection unit of a PET device is installed within an MRI device, thus sequentially obtaining PET images and MRI images.

However, the scheme disclosed in International Patent Publication No. WO06/119085 is configured using a structure in which scintillation crystals and an optical device are connected to each other through an optical fiber, thus deteriorating the performance of PET. Further, this scheme is problematic in that it is difficult to extend a axial FOV of a PET scanner due to the limitation of a space in which the optical fiber is installed.

Hybrid PET/MR imaging system, disclosed in International Patent Publication No. WO08/127369, is configured such that a PET scanner is disposed in the same radio frequency isolation space as MRI.

However, time is required to transport an object from the first scanner to the second scanner through the transport rail, and thus it is impossible to simultaneously obtain PET and MRI images.

The integrated PET/MRI imaging system and PET detector for an APD base for use in simultaneous PET/MRI imaging, disclosed in International Patent Publication No. WO06/071922, is provided to be used for PET/MRI imaging in which an APD-based PET module is integrated, and is configured such that each detector includes an array of scintillation crystals read out by an array of APDs, the APD-based PET module being positioned in the tunnel of an MR scanner. Further, artifact-free images may be captured by an APD-based PET and MRI system that can be used for a high-resolution and cost-effective integrated PET/MRI system.

However, the above scheme disclosed in International Patent Publication No. WO06/071922 is configured using a structure in which a pre-amplifier is located in an MRI bore, and thus a problem arises in that, due to the spatial restrictions of the inside of the MRI bore, a signal amplification circuit must be integrated, and in that a protection device, such as a copper shield for protecting the circuits from the influence of the inherent characteristics of an MRI environment, that is, high magnetic fields and RF signals, is required. Further, there is a fear that the generation of heat by the signal amplification circuit itself and the generation of heat by the copper shield attributable to gradient coils may cause the reduction of the amplification factor of a photo sensor and the deterioration of PET performance with the passage of time, and that the insertion of the signal amplification circuit and the copper shield may result in the deterioration of MRI performance such as by reducing the intensity of a magnetic gradient field and deteriorating sensitivity to MRI images.

SUMMARY

One aspect of the present invention provides a PET-MRI combination apparatus, which can simultaneously or sequentially obtain PET images and MRI images, and can extend transaxial and axial fields of view (FOV).

Another aspect of the present invention provides a PET-MRI combination apparatus, which minimizes the deterioration of PET performance attributable to the generation of heat by a PET circuit unit and a copper shield and the deterioration of MRI performance occurring when a PET device is located in an MRI bore while preventing interference from occurring in the PET device due to the influence of a magnetic field produced in the MRI bore and minimizing the deterioration of PET performance that may occur when an optical fiber is used.

One aspect of the present invention provides a Positron Emission Tomography (PET)-Magnetic Resonance Imaging (MRI) combination apparatus, comprising an MRI bore configured to capture an MR image of a object which moves into an imaging space; a PET detector installed inside the imaging space of the MRI bore, and configured such that a plurality of scintillation crystal arrays, each having a plurality of scintillation crystals arranged in a ring shape, is arranged in a longitudinal direction so as to extend a axial field of view (FOV); a PET circuit unit installed outside the MRI bore to prevent the PET circuit unit from being influenced by a magnetic field produced in the MRI bore, and configured to include therein a signal amplification circuit and a signal processing circuit; and a cable configured to connect the PET detector to the PET circuit unit.

Preferably, the PET detector comprises a photo sensor for converting scintillation detected by the scintillation crystals into charge signals, and the cable is connected to the photo sensor and is configured to transmit the charge signals to the PET circuit unit.

Preferably, the photo sensor is a semiconductor photo sensor.

Preferably, the PET-MRI combination apparatus further comprises an object table equipped with a movable bed for allowing the object to move into the imaging space, wherein the PET circuit unit is installed within the object table.

Preferably, the scintillation crystals are each implemented as one of Bismuth Germanate (BGO), Lutetium Oxyorthosilicate (LSO), Lutetium Yttrium Oxyorthosilicate (LYSO), Lutetium Aluminum Perovskite (LuAP), Lutetium Yttrium Aluminum Perovskite (LuYAP), Lanthanum Bromide ($LaBr_3$) and Lutetium Iodide ($LuI_3$), which are free from gadolinium, or as a multi-layer structure thereof.

Preferably, the cable is a low-capacitance cable which does not influence performance of PET imaging even if a cable having such a length as to extend outwards from the MRI bore is used.

Preferably, the cable has a length from 5 cm to 900 cm so as to prevent performance of PET and MRI imaging from being deteriorated.

Preferably, the cable is a multi-channel cable which comprises a number of channels corresponding to a number of charge signals output from the photo sensor and transmits respective charge signals to the PET circuit unit through corresponding channels.

Preferably, the cable is a multi-channel cable comprising a number of channels exceeding a number of charge signals output from the photo sensor, and the channels corresponding to the charge signals in number transmit respective charge signals to the PET circuit unit, and remaining channels not participating in the transmission of the charge signals are grounded, thus minimizing interference of the charge signals.

Preferably, the cable is a multi-channel fine coaxial cable having an excellent shielding ability.

Preferably, the cable is a multi-channel twisted-pair cable having minimized interference.

BRIEF DESCRIPTION OF THE DRAWINGS

The above and other features and advantages of the present invention will be more clearly understood from the following detailed description taken in conjunction with the accompanying drawings, in which:

FIG. 2 is a perspective view of a PET detector installed in an MRI bore;

FIG. 3 is a schematic diagram of a PET-MRI combination apparatus; and

DESCRIPTION OF EMBODIMENTS

Hereinafter, embodiments of a PET-MRI combination apparatus according to the present invention will be described in detail with reference to the attached drawings.

Figure 1:
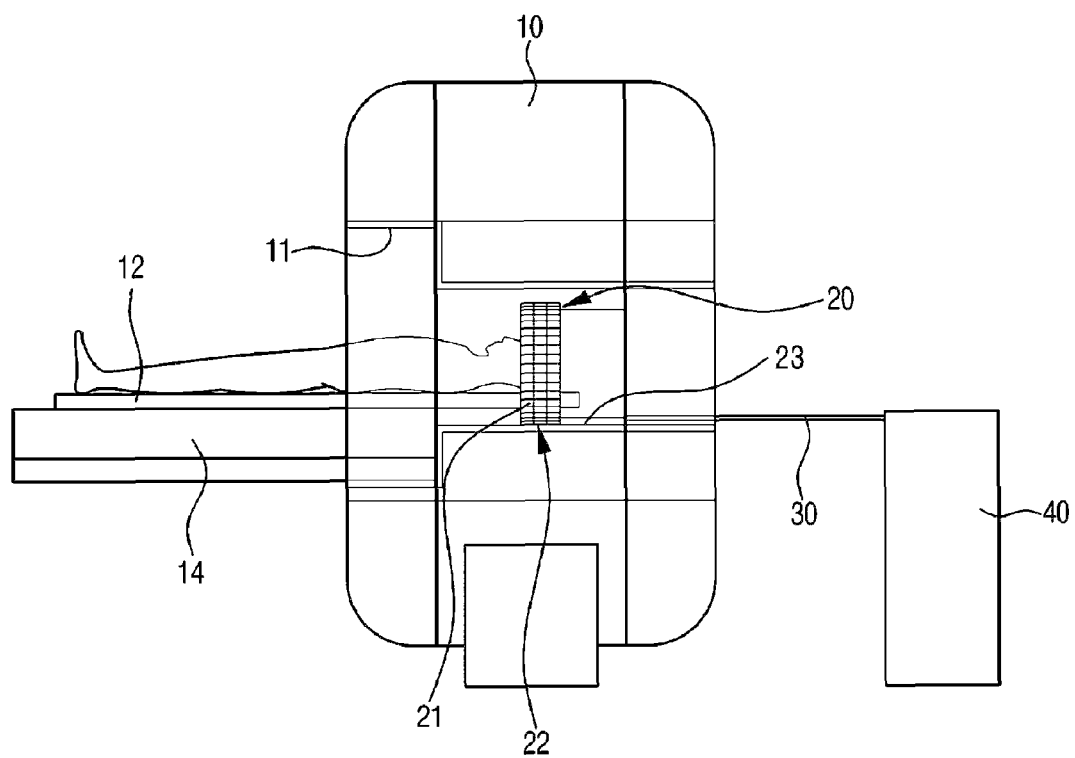
FIG. 1 is a sectional view of a PET-MRI combination apparatus according to a first embodiment of the present invention.

FIG. 1 is a sectional view showing a PET-MRI combination apparatus according to a first embodiment of the present invention, FIG. 2 is a perspective view of a PET detector installed in an MRI bore, and FIG. 3 is a schematic diagram of a PET-MRI combination apparatus.

As shown in the drawings, the PET-MRI combination apparatus according to the first embodiment of the present invention includes an MRI bore 10 for capturing MR images of an object (for example, Patient), a PET detector 20 installed in the MRI bore 10, a cable 30, one end of which is connected to the PET detector 20, and a PET circuit unit 40 connected to the other end of the cable 30.

The MRI bore 10 is configured such that an imaging space 11 is formed through the center of the MRI bore 10, and a bed 12 for transporting an object is mounted to allow the object to move into the imaging space 11 while the object is lying on the bed. The bed 12 is slidably formed on an object table 14 to transport the object.

The PET detector 20 is formed in the shape of a cylinder having a predetermined inside diameter to allow the object to pass therethrough and is provided in the imaging space 11. On one side of the PET detector 20, a plurality of scintillation crystals 21 is arranged in a ring shape to constitute a scintillation crystal array 22. A plurality of scintillation crystal arrays 22 is arranged along the longitudinal direction of the PET detector 20. The opposite end of each of the scintillation crystals 21 is connected to a photo sensor 23, and thus the PET detector is constructed.

The scintillation crystals 21 to be used to constitute the PET detector must have several characteristics so as to detect 511 keV gamma rays that are produced in opposite directions through a pair annihilation procedure. First, in order to improve system sensitivity, the density of the scintillation crystals must be high for increasing the gamma ray detection efficiency. Second, in order to improve the energy resolution of a system, efficiency for converting gamma rays into scintillation must be high. Third, in order to improve the temporal resolution of the system and minimize dead time, the time for which incident gamma rays are rapidly converted into scintillation in the scintillation crystals 21, that is, decay time, must be short. Further, in order to design a PET system in consideration of MR compatibility, scintillation crystals must have low magnetic susceptibility and must be prevented from causing distortions in MRI images. Therefore, such a scintillation crystal in the present invention may be implemented as one of Bismuth Germanate (BGO), Lutetium Oxyorthosilicate (LSO), Lutetium Yttrium Oxyorthosilicate (LYSO), Lutetium Aluminum Perovskite (LuAP), Lutetium Yttrium Aluminum Perovskite (LuYAP), Lanthanum Bromide (LaBr$_3$) and Lutetium Iodide (LuI$_3$), which are free from gadolinium, or may be implemented as a multi-layer structure thereof.

The cable 30 is connected to the photo sensor 23 at one end thereof, and is preferably implemented as a compact multi-channel cable. The cable 30 has a length extending from the end of the transaxial direction of the MRI bore 10 by such a distance that it can escape from the range of the influence of a magnetic field produced by the MRI bore 10. Preferably, the total length of the cable 30 is 300 cm or longer.

In more detail, one of the principal factors deteriorating the performance of a PET device is input noise that reaches a signal amplification circuit 41. The magnitude of this input noise that is quantitatively represented, that is, the magnitude of electric noise occurring in the PET detector, is represented by Equivalent Noise Charge (ENC). A method of minimizing the input noise of the signal amplification circuit 41 using the equation of ENC is intended to reduce capacitance between the photo sensor 23 and the signal amplification circuit 41. Accordingly, the photo sensor 23 and the signal amplification circuit 41 are generally installed as close to each other as possible. However, in the case of the PET-MRI combination apparatus, when a semiconductor sensor and the signal amplification circuit are installed close to each other, the deterioration of PET performance attributable to both the generation of heat by the signal amplification circuit and strong MR signals and the deterioration of MRI performance attributable to the insertion of a conductive material may occur.

The cable 30 required to transmit charge signals output from the photo sensor 23 preferably has the following characteristics. That is, the cable 30 may be one of a multi-channel cable which is capable of supplying a bias voltage to the photo sensor 23 and transmitting the output signal of the photo sensor 23, a cable which does not cause the attenuation of a supply voltage even if the length of the cable increases so that the photo sensor 23 can have a constant amplification factor, a cable which does not deteriorate PET performance because the capacitance of the cable is low and then does not greatly influence the increase in an ENC value even if the length of the cable increases, a cable which does not deteriorate the performance of MR imaging even if the cable is inserted into the MRI bore, and a compact cable which enables the whole body PET/MRI structure to be implemented without requiring the modification of the structure of the MRI bore, and may include a connector for such a cable.

A flat cable, a twisted-pair cable, a coaxial cable, etc. capable of minimizing signal interference between channels may be used as the above cable 30.

A PET-MRI combination apparatus using a method of transmitting charge signals output from the photo sensor may be preferably configured using the following design methods. First, a signal transmission system may be designed to use a flat cable designed to minimize interference that may occur in multi-channel signals by adding, in the multi-channel cable, ground lines to opposite ends of all the channels of a signal transmission line, that is, the cable 30, or to use a fine coaxial cable designed to shield each individual signal transmission line. Alternatively, a system may be designed to use a cable 30 which has such a length as to extend outwards from the MRI bore and does not cause the deterioration of PET performance. When the cable in this case satisfies the conditions of low capacitance, low conductive resistance, and high characteristic impedance, an effective design may be achieved.

As the results of experiments conducted in items for the basic PET performance using cables 30 of a length from 5 cm to 500 cm which satisfy the above-described design conditions, variation coefficients related to the magnitudes of output signals, energy resolution, and temporal resolution were measured as values below 5%. This proved that, even if a PET device is constructed using a cable of a length of 900 cm in which an additional experiment was conducted, in addition to the cable of a length of 500 cm which falls within an error range in measurement equipment and the system and is used in the present experiments, the performance of the PET device is not deteriorated. Further, it was proved that, even if the PET detector and the cable used in the present experiments are inserted into the MRI bore, the performance of MR imaging is not deteriorated.

The PET circuit unit 40 includes the signal amplification circuit 41 connected to the other end of the cable 30, and a signal processing circuit 42 connected to the signal amplification circuit 41.

A process in which the PET-MRI combination apparatus according to the embodiment of the present invention, which is constructed as described above, is operated will be described below.

When an object is moved into the imaging space 11 while lying on the bed 12, the PET detector 20 captures functional images of a diseased part of the object at the same time that the MRI bore 10 captures MR images of the diseased part while the diseased part passes through the inside of the PET detector 20. Further, the MRI bore 10 and the PET detector 20 may capture images separately rather than simultaneously according to the circumstances.

The image signals captured and obtained by the MRI bore 10 are transmitted to an MRI image processor 13, and then the respective output signals are converted into images. The images are transmitted to a combined image processor 50.

The signal processing performed by the PET device will be described below. The scintillation crystals 21 constituting each scintillation crystal array 22 detect gamma rays emitted from a living body and convert the gamma rays into scintillation. In this case, the scintillation crystal arrays 22 are characterized in that a axial field of view (FOV) is extended because a plurality of scintillation crystal arrays 22 is arranged along the longitudinal direction of the PET detector, as shown in the drawings. Further, it is possible to extend both transaxial and axial fields of view (FOV) without requiring the modification of the structure of the MRI bore 10.

The scintillation detected by the scintillation crystals 21 is transmitted to the photo sensor 23, and is then converted into charge signals. In conventional technologies, a Photo-Multiplier Tube (PMT) was mainly used as the photo sensor. However, such a PMT has a problem in that it cannot be used inside the MRI bore, and thus a semiconductor photo sensor is used as the photo sensor so that it is used inside the MRI bore 10. The charge signals output from the semiconductor photo sensor 23 are transmitted to the signal amplification circuit 41, located outside the MRI bore 10, through the cable 30. Fine charge signals are amplified into voltage signals while passing through the signal amplification circuit 41, and amplified signals are encoded/decoded into the energy, interaction time and position information while passing through the signal processing circuit 42. The converted images are transmitted to the combined image processor 50 and are then combined into a single image by the image processor 50. That is, a combined image into which an anatomical image and a functional image are combined is obtained. Further, the combined image processor 50 may selectively combine respective images into a single image or separate a single image into respective images.

Figure 4:
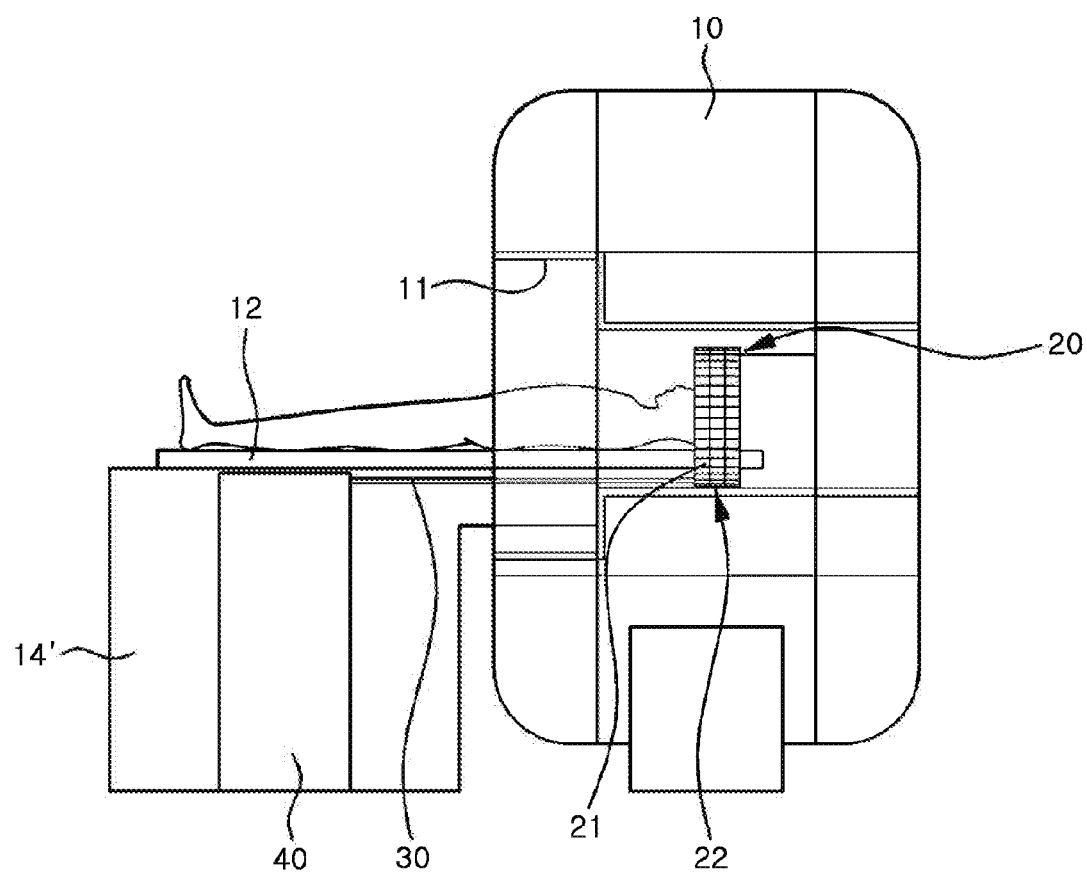
FIG. 4 is a sectional view of a PET-MRI combination apparatus according to a second embodiment of the present invention.

Similarly, a PET-MRI combination apparatus according to a second embodiment of the present invention has a structure in which a cable 30 is extended to an object table 14' and a PET circuit unit 40 connected to the cable 30 is installed within the object table 14', as shown in FIG. 4. Further, the PET-MRI combination apparatus is characterized in that an installation area occupied by the PET-MRI combination apparatus is reduced. Other structures and operations thereof are identical to those of the first embodiment of the present invention.

In the PET-MRI combination apparatus according to the present invention, it is possible to structurally arrange a plurality of scintillation crystal arrays 22 along a longitudinal direction, and thus an advantage of easily extending a axial field of view (FOV) without modifying the structure of an MRI bore 10 may be obtained.

Further, the PET-MRI combination apparatus is characterized in that the deterioration of PET performance attributable to the use of an optical fiber and the generation of heat by both a signal amplification circuit and a copper shield may be minimized.

Furthermore, the PET-MRI combination apparatus is characterized in that the axial field of view (FOV) of the PET detector 20 installed in the limited inner space of the MRI bore 10 can be extended, and a whole-body system can be designed.

When the PET signal amplification circuit and the signal processing circuit are located in the MRI bore, a shielding device is required to protect the PET system from MRI magnets, gradient coils, and RF pulses.

However, according to one embodiment of the present invention, a copper shielding method for protecting signal amplification/processing circuits from the high magnetic field of the MRI device can be easily implemented, and magnetic field shielding using relatively thick copper is possible. Further, the attenuation and diffusion of gamma rays caused by a copper shielding material does not occur, and the temperature of the PET detector 20 does not increase because of eddy current generated in the copper shield due to the magnetic gradient field in MR. Since the integration of the signal amplification circuit is not essential, the period and cost required for the development of devices can be reduced. Further, since the increase in the temperature of the PET detector 20 attributable to heat generated by the PET circuit unit 40 does not occur, PET performance is not deteriorated, and a separate cooling system is not required.

Furthermore, from the standpoint of the MRI device, the slope of the magnetic gradient field is not decreased by inserting a conductive material into the PET device, and the deterioration of sensitivity is reduced. In particular, the deterioration of uniformity and signal to noise ratio (SNR) of MR images which may occur in the whole-body PET/MRI combination apparatus can be minimized.

As described above, a PET-MRI combination apparatus according to one embodiment is advantageous in that it can prevent interference from occurring in a PET device due to the influence of a magnetic field produced in an MRI bore while simultaneously or sequentially obtaining anatomical images (MRI images) and functional images (PET images), thus improving the reliability of products.

Further, the PET-MRI combination apparatus according to one embodiment is advantageous in that a plurality of scintillation crystal arrays is arranged in a longitudinal direction, thus easily extending a axial field of view (FOV).

Furthermore, the PET-MRI combination apparatus according to the present invention is advantageous in that scintillation crystals and a photo sensor are installed inside the MRI bore, and a PET circuit unit composed of a signal amplification circuit and a signal processing circuit is installed outside the MRI bore, so that an installation space for a PET detector can be reduced, and thus the increase in the diameter of the PET detector (the extension of a transaxial FOV) can be realized to such an extent that the entire body can be captured.

Furthermore, the PET-MRI combination apparatus according to one embodiment is advantageous in that factors deteriorating PET performance due to heat generated by signal amplification circuits such as a pre-amplifier and a shaping amplifier can be eliminated from the PET detector, and the deterioration of PET performance, occurring when an optical fiber is used in the prior art, can be minimized.

In addition, the PET-MRI combination apparatus according to one embodiment is advantageous in that, since the insertion of conductive impurities into the MRI bore is reduced, the deterioration of the uniformity and S/N ratio of MRI images can be minimized.

Although some embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Positron Emission Tomography (PET)-Magnetic Resonance Imaging (MRI) combination apparatus, comprising:
   an MRI bore configured to capture an MR image of an object which moves into an imaging space;
   a PET detector installed inside the imaging space of the MRI bore, and configured such that a plurality of scintillation crystal arrays, each having a plurality of scintillation crystals arranged in a ring shape, is arranged in a longitudinal direction so as to extend a axial field of view (FOV);
   a PET circuit unit installed outside the MRI bore to prevent the PET circuit unit from being influenced by a magnetic field produced in the MRI bore, and configured to include therein a signal amplification circuit and a signal processing circuit; and
   a cable configured to connect the PET detector to the PET circuit unit,
   wherein the PET detector comprises photo sensor, and the signal amplification circuit comprises pre-amplifier and shaping amplifier, and
   the cable is a multi-channel cable that is connected from the photo sensor to the signal amplification circuit, and is configured to transmit charge signals to the signal amplification circuit and further transmits voltage and bias signals to the PET detector, and has a high-characteristic impedance and wherein the cable has a length from 5 cm to 500 cm so as to prevent performance of PET and MRI imaging from being deteriorated.

2. The PET-MRI combination apparatus according to claim 1, wherein:

the photo sensor converts scintillation detected by the scintillation crystals into the charge signals.

3. The PET-MRI combination apparatus according to claim 2, wherein the photo sensor is a semiconductor photo sensor.

4. The PET-MRI combination apparatus according to claim 2, wherein the cable is a multi-channel cable which comprises a number of channels corresponding to a number of charge signals output from the photo sensor and transmits respective charge signals to the PET circuit through corresponding channels.

5. The PET-MRI combination apparatus according to claim 2, wherein:
the cable is a multi-channel cable comprising a number of channels exceeding a number of charge signals output from the photo sensor; and
the channels corresponding to the charge signals in number transmit respective charge signals to the PET circuit, and remaining channels not participating in the transmission of the charge signals are grounded, thus minimizing interference of the charge signals.

6. The PET-MRI combination apparatus according to claim 2, wherein the cable is a multi-channel fine coaxial cable.

7. The PET-MRI combination apparatus according to claim 2, wherein the cable is a multi-channel twisted-pair cable.

8. The PET-MRI combination apparatus according to claim 1, further comprising an object table equipped with a movable bed for allowing the object to move into the imaging space, wherein the PET circuit is installed within the object table.

9. The PET-MRI combination apparatus according to claim 8, wherein the scintillation crystals are each implemented as one of Bismuth Germanate (BGO), Lutetium Oxyorthosilicate (LSO), Lutetium Yttrium Oxyorthosilicate (LYSO), Lutetium Aluminum Perovskite (LuAP), Lutetium Yttrium Aluminum Perovskite (LuYAP), Lanthanum Bromide ($LaBr_3$) and Lutetium Iodide ($LuI_3$) or as a multi-layer structure thereof.

10. The PET-MRI combination apparatus according to claim 1, wherein the cable is a low-capacitance cable.

11. The PET-MRI combination apparatus according to claim 1, wherein the cable is a low conductive resistance cable.

12. The PET-MRI combination apparatus according to claim 11, wherein the scintillation crystals are each implemented as one of Bismuth Germanate (BGO), Lutetium Oxyorthosilicate (LSO), Lutetium Yttrium Oxyorthosilicate (LYSO), Lutetium Aluminum Perovskite (LuAP), Lutetium Yttrium Aluminum Perovskite (LuYAP), Lanthanum Bromide ($LaBr_3$) and Lutetium Iodide ($LuI_3$) or as a multi-layer structure thereof.

13. The PET-MRI combination apparatus according to claim 1, wherein the scintillation crystals are each implemented as one of Bismuth Germanate (BGO), Lutetium Oxyorthosilicate (LSO), Lutetium Yttrium Oxyorthosilicate (LYSO), Lutetium Aluminum Perovskite (LuAP), Lutetium Yttrium Aluminum Perovskite (LuYAP), Lanthanum Bromide ($LaBr_3$) and Lutetium Iodide ($LuI_3$) or as a multi-layer structure thereof.

* * * * *